United States Patent
Schulze

(10) Patent No.: US 9,793,362 B2
(45) Date of Patent: Oct. 17, 2017

(54) SEMICONDUCTOR DEVICE HAVING AN IMPURITY CONCENTRATION AND METHOD OF MANUFACTURING THEREOF

(71) Applicant: Infineon Technologies AG, Neubiberg (DE)

(72) Inventor: Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/220,939

(22) Filed: Jul. 27, 2016

(65) Prior Publication Data

US 2016/0336409 A1 Nov. 17, 2016

Related U.S. Application Data

(62) Division of application No. 14/309,288, filed on Jun. 19, 2014, now Pat. No. 9,425,063.

(51) Int. Cl.
| | | |
|---|---|---|
| *H01L 21/02* | (2006.01) | |
| *H01L 29/36* | (2006.01) | |
| *H01L 21/322* | (2006.01) | |
| *H01L 21/263* | (2006.01) | |
| *H01L 29/66* | (2006.01) | |

(Continued)

(52) U.S. Cl.
CPC ............ *H01L 29/36* (2013.01); *H01L 21/263* (2013.01); *H01L 21/26513* (2013.01); *H01L 21/3221* (2013.01); *H01L 29/6634* (2013.01); *H01L 29/66136* (2013.01); *H01L 29/7395* (2013.01); *H01L 29/7396* (2013.01); *H01L 29/861* (2013.01)

(58) Field of Classification Search
CPC ............ H01L 21/263; H01L 21/26513; H01L 21/3221; H01L 29/36; H01L 29/66136; H01L 29/6634; H01L 29/7395; H01L 29/7396; H01L 29/861
USPC .... 257/335, 330, 77, 43, 655; 438/446, 407; 430/5
See application file for complete search history.

(56) References Cited

U.S. PATENT DOCUMENTS

| | | |
|---|---|---|
| 4,809,196 A | 2/1989 | Miller |
| 4,855,197 A | 8/1989 | Zapka et al. |

(Continued)

FOREIGN PATENT DOCUMENTS

CN 101405847 A 4/2009

OTHER PUBLICATIONS

Alt, et al., "Piezospectroscopy of Nitrogen-Oxygen Shallow Donor Complexes in Silicon", Physical Review B Condensed Matter and Materials Physics, The American Physical Society, Sep. 2010, vol. 82, No. 11, Third Series, pp. 1-11.

(Continued)

*Primary Examiner* — Mohammed Shamsuzzaman
(74) *Attorney, Agent, or Firm* — Murphy, Bilak & Homiller, PLLC

(57) ABSTRACT

A method of manufacturing a semiconductor device includes irradiating the semiconductor body with particles through a first side of the semiconductor body, removing at least a part of impurities from an irradiated part of the semiconductor body by out-diffusion during thermal treatment in a temperature range between 450° C. to 1200° C., and forming a first load terminal structure at the first side of the semiconductor body.

7 Claims, 4 Drawing Sheets

(51) Int. Cl.
*H01L 29/739* (2006.01)
*H01L 29/861* (2006.01)
*H01L 21/265* (2006.01)

(56) References Cited

U.S. PATENT DOCUMENTS

| | | | |
|---|---|---|---|
| 5,352,615 | A | 10/1994 | Limb et al. |
| 5,548,156 | A | 8/1996 | Miwa et al. |
| 5,635,738 | A | 6/1997 | Shoda et al. |
| 6,191,009 | B1 | 2/2001 | Tamatsuka et al. |
| 6,368,938 | B1 | 4/2002 | Usenko |
| 6,413,310 | B1 | 7/2002 | Tamatsuka et al. |
| 6,544,656 | B1 | 4/2003 | Abe et al. |
| 6,838,395 | B1 | 1/2005 | Kanzawa et al. |
| 7,759,227 | B2 | 7/2010 | Maeda et al. |
| 2001/0007240 | A1 | 7/2001 | Dietze et al. |
| 2001/0055689 | A1 | 12/2001 | Park |
| 2003/0106482 | A1 | 6/2003 | Kononchuk et al. |
| 2005/0211158 | A1 | 9/2005 | Hoshi et al. |
| 2006/0264051 | A1 | 11/2006 | Thibaut et al. |
| 2008/0286952 | A1 | 11/2008 | Miyairi et al. |
| 2009/0004458 | A1* | 1/2009 | Falster ............... H01L 21/2205 428/310.5 |
| 2010/0047563 | A1 | 2/2010 | Nakai et al. |
| 2010/0151663 | A1* | 6/2010 | Ohnuma ........... H01L 21/76254 438/479 |
| 2010/0163807 | A1 | 7/2010 | Fukuda et al. |
| 2010/0273310 | A1* | 10/2010 | Hanaoka ........... H01L 21/76254 438/458 |
| 2011/0042791 | A1 | 2/2011 | Schulze et al. |
| 2011/0136329 | A1 | 6/2011 | Sugitani et al. |
| 2012/0032305 | A1 | 2/2012 | Kitamura |
| 2012/0187419 | A1 | 7/2012 | Elpelt et al. |
| 2012/0292640 | A1 | 11/2012 | Quick et al. |
| 2013/0137214 | A1 | 5/2013 | Bisotto et al. |
| 2014/0097488 | A1 | 4/2014 | Schulze et al. |
| 2014/0319517 | A1 | 10/2014 | Noda et al. |
| 2015/0104926 | A1* | 4/2015 | Libbert ............. H01L 21/76254 438/458 |
| 2015/0118861 | A1 | 4/2015 | Sucher et al. |

OTHER PUBLICATIONS

Ganagona, et al., "Defects in P-Type Cz-Silicon Irradiated at Elevated Temperatures", Physica Status Solidi C, www.pss-c.com, No. 10-11, 2009-2012, Wiley-VCH Verlag GmbH & Co., pp. 1-4.

Pichler, "Intrinsic Point Defects, Impurities and their Diffusion in Silicon", 2004, pp. 103-130.

\* cited by examiner

US 9,793,362 B2

SEMICONDUCTOR DEVICE HAVING AN IMPURITY CONCENTRATION AND METHOD OF MANUFACTURING THEREOF

BACKGROUND

In semiconductor devices such as semiconductor diodes, insulated gate bipolar transistors (IGBTs) or insulated gate field effect transistors (IGFETs) a low doping concentration of a base material such as a wafer before front end of line (FEOL) processing serves for realizing a DC voltage blocking requirement of the semiconductor device. Apart from dopants determining an initial doping concentration in the base material, additional impurities may be present, for example caused by a growth process of the base material such as magnetic Czochraiski growth of silicon ingots. Front-end-of-line (FEOL) processing may lead to formation of undesired complexes including the additional impurities. One example of such undesired complexes are electrically active complexes, for example nitrogen-oxygen-complexes or $C_iO_i$ complexes altering a doping concentration or a recombination/generation characteristic of the semiconductor body or of the semiconductor device(s) in the semiconductor body.

It is desirable to provide a method of reducing an impurity concentration in a semiconductor body, a method of manufacturing a semiconductor device and a semiconductor device.

SUMMARY

According to an embodiment, a method of reducing an impurity concentration in a semiconductor body comprises irradiating the semiconductor body with particles through a first side of the semiconductor body. The method further comprises removing at least a part of impurities from an irradiated part of the semiconductor body by out-diffusion during thermal treatment in a temperature range between 450° C. to 1200° C.

According to another embodiment, a method of manufacturing a semiconductor device comprises irradiating the semiconductor body with particles through a first side of the semiconductor body. The method further comprises removing at least a part of impurities from an irradiated part of the semiconductor body by out-diffusion during thermal treatment in a temperature range between 450° C. to 1200° C. The method further comprises forming a first load terminal structure at the first side of the semiconductor body.

According to another embodiment, a semiconductor device comprises a silicon body having opposite first and second sides. A first part of the silicon body adjoins the first side and a second part of the silicon body is disposed between the first part and the second side. An average concentration of one of nitrogen and carbon in the first part is less than 60% of an average concentration of the one of nitrogen and carbon in the second part.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

DETAILED DESCRIPTION

In the following detailed description, reference is made to the accompanying drawings, which form a part hereof, and in which are shown by way of illustrations specific embodiments in which the disclosure may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present disclosure includes such modifications and variations. The examples are described using specific language that should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element (s) adapted for signal transmission may exist between the electrically coupled elements, for example elements that temporarily provide a low-ohmic connection in a first state and a high-ohmic electric decoupling in a second state.

The Figures illustrate relative doping concentrations by indicating "−" or "+" next to the doping type "n" or "p". For example, "n$^−$" means a doping concentration that is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
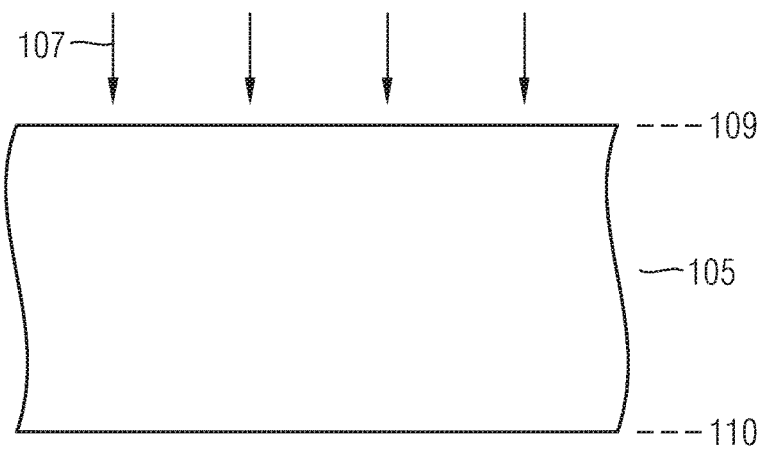
FIG. 1A is a schematic cross-sectional view of a portion of a semiconductor body for illustrating a process of irradiating the semiconductor body with particles through a first side of the semiconductor body being part of a method of reducing an impurity concentration in a semiconductor body.
Figure 1B:
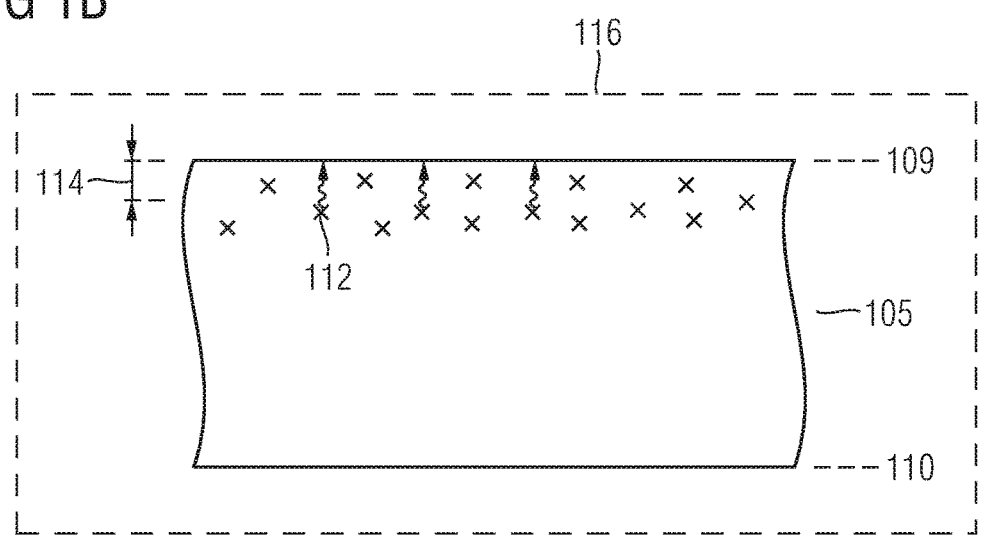
FIG. 1B is a schematic cross-sectional view of the semiconductor body of FIG. 1A for illustrating a process of removing at least a part of impurities from an irradiated part of the semiconductor body by out-diffusion during thermal treatment in a temperature range between 450° C. to 1200° C.

FIGS. 1A to 1B are schematic cross-sectional views of a portion of a semiconductor body 105 for illustrating a method of reducing an impurity concentration in the semiconductor body.

FIG. 1A is a schematic cross-sectional view of the semiconductor body 105 for illustrating a process of irradiating the semiconductor body 105 with particles 107 through a first side 109 opposite to a second side 110.

FIG. 1B a schematic cross-sectional view of the semiconductor body 105 of FIG. 1A for illustrating a process of removing at least a part of impurities 112 from an irradiated part 114 of the semiconductor body 105 by out-diffusion during thermal treatment in a temperature range between 450° C. to 1200° C.

According to an embodiment the semiconductor body 105 is a silicon semiconductor body obtained by a Czochralski growth process, for example a magnetic Czochralski (MCZ) silicon semiconductor body. According to other embodiments, the semiconductor body may be another silicon semiconductor body or another single crystalline semiconductor body including impurities.

According to an embodiment, the impurities 112 include nitrogen. In case of nitrogen impurities and according to an embodiment, the thermal treatment is carried in the temperature range between 500° C. to 1200° C., or in the temperature range between 600° C. to 1000° C., or even in the temperature range between 650° C. to 850° C. Irradiation of the semiconductor body 105 with the particles 107 allows for a decomposition of dimeric interstitial N$_2$ into fast-diffusing single interstitial N. The thermal treatment allows for an out-diffusion of the fast-diffusing single instital N from the semiconductor body 105 through the first side 109. A degree of decomposition of the nitrogen in the semiconductor body 105, i.e. a ratio of single instital N after irradiation to dimeric interstitial N$_2$ before irradiation in the irradiated part 114 may be adjusted by one or more of a species of particles, an irradiation dose, an irradiation energy, a number of particle irradiations, for example.

According to another embodiment, the impurities 112 include carbon. In case of carbon impurities and according to an embodiment, the thermal treatment is carried in the temperature range between 450° C. to 1000° C., or in the temperature range between 550° C. to 900° C., or even in the temperature range between 600° C. to 800° C. Irradiation of the semiconductor body 105 with the particles 107 allows for a transformation of substitutional carbon into faster-diffusing interstitial carbon, for example by the so-called kick-out mechanism. The thermal treatment allows for an out-diffusion of the fast-diffusing interstitial carbon from the semiconductor body 105 through the first side 109. A degree of transformation of the carbon in the semiconductor body 105, i.e. a ratio of interstitial C after irradiation to substitutional C before irradiation in the irradiated part 114 may be adjusted by one or more of a species of particles, an irradiation dose, an irradiation energy, a number of particle irradiations, for example.

According to an embodiment, the particles include at least one of protons and helium ions. Irradiation with protons and/or helium ions may be carried out one or multiple times. In case of proton irradiation and according to an embodiment, the proton irradiation is carried out at energies ranging from one or several hundreds of key to 5 MeV, or from 200 keV to 4 MeV, or from 300 keV to 1.5 MeV. According to another embodiment, a plurality of proton irradiations, for example two, three, four or five proton irradiations are carried out at different energies, e.g. from below 500 keV to more than 1 MeV. According to an embodiment, the proton irradiation is carried out at a dose ranging from $0.5 \times 10^{13}$ protons/cm$^2$ to $5 \times 10^{14}$ protons/cm$^2$, or from $1 \times 10^{13}$ protons to $1 \times 10^{14}$ protons/cm$^2$. According to another embodiment, a plurality of proton irradiations, for example two, three, four or five proton irradiations are carried out at different doses. A sum of all irradiation doses of the plurality of proton irradiations may range from several $10^{13}$ protons/cm$^2$ to tens of $10^{14}$ protons/cm$^2$, e.g. from $2 \times 10^{13}$ protons/cm$^2$ to $8 \times 10^{14}$ protons/cm$^2$. Also a combination of different irradiation doses and energies may be used.

In case of irradiation with helium ions and according to an embodiment, the irradiation is carried out at energies ranging from 1 MeV to 20 MeV, or from 2 MeV to 10 MeV.

According to another embodiment, a plurality of irradiations with helium ions, for example two, three, four or five irradiations with helium ions are carried out at different energies. According to an embodiment, the irradiation with helium ions is carried out at a dose ranging from $5 \times 10^{11}$ helium ions/cm$^2$ to $5 \times 10^{13}$ helium ions/cm$^2$, or from $1 \times 10^{12}$ helium ions/cm$^2$ to $1 \times 10^{13}$ helium ions/cm$^2$. According to another embodiment, a plurality of irradiations with helium ions, for example two, three, four or five irradiations with helium ions are carried out at different doses. Also a combination of different irradiation doses and energies may be used.

Irradiation with any other particles suitable to transform substitutional carbon into faster-diffusing interstitial carbon and/or suitable to decompose dimeric interstitial N$_2$ into fast-diffusing single interstitial N may be used, for example deuterium.

According to an embodiment, the thermal treatment is carried out for a duration between 10 seconds to 20 hours, or between 10 minutes to 10 hours, or even between 1 hour to 5 hours. The thermal treatment may be carried out in a thermal processing system 116, for example in a furnace and/or a rapid thermal processing (RTP) system. The semiconductor body 105 may be supported by a holding fixture in the thermal processing system 116, for example.

A depth of the irradiated part 114, i.e. a vertical extension of the irradiated part 114 into the semiconductor body 105 from the first side 109 may be adjusted with regard to electric parameter requirements of a semiconductor device in the semiconductor body 105. By way of example, the depth may be adjusted with regard to a specified blocking voltage of the semiconductor device. The depth may be chosen around, equal to or greater than a vertical extension of a space charge region into the semiconductor body 105 at an applied specified blocking voltage. The depth may be chosen around, equal to or greater than a vertical extension of a drift zone into the semiconductor body 105 or of the device after wafer thinning to a final device thickness. The depth may be chosen to end within a field stop zone, or a drain or an emitter region of the semiconductor device, for example.

The method described above with reference to FIGS. 1A, 1B allows for a reduction of an impurity concentration in the semiconductor body 105. Thus, undesired complex formation including the impurities and caused by FEOL processing may be avoided or reduced. The method described above with reference to FIGS. 1A, 1B thus allows for manufacturing of more reliable doping concentration (s) and/or a recombination/generation characteristic (s) of semiconductor device (s) in the semiconductor body 105.

FIG. 10 is a schematic cross-sectional view of the semiconductor body of FIG. 1B for illustrating a process of forming a first load terminal structure 120 at the first side 109 of the semiconductor body 105 being part of a method of manufacturing a semiconductor device.

The process of forming the first load terminal structure 120 may comprise doping processes of doping the semiconductor body 105 at the first side 110, e.g. diffusion and/or ion implantation processes for forming doped semiconductor region (s) in the semiconductor body 105 at the first side 109. The doped semiconductor region (s) in the semiconductor body 105 of the first load terminal structure 120 may include doped source and body regions of a vertical power FET or of an emitter of an IGBT, or an anode or cathode region of a vertical power semiconductor diode. According to an embodiment, a depth of the first load terminal structure 120, i.e. a vertical extension of the first load terminal structure 120 is smaller than the depth or vertical extension of the irradiated part 114 illustrated in FIG. 1A.

In the course of processing the semiconductor body 105 at the first side 109, depending on the semiconductor device to be formed in the semiconductor body 105, a control terminal structure such as a planar gate structure and/or a trench gate structure including gate dielectric (s) and gate electrode (s) may be formed.

Figure 2A:
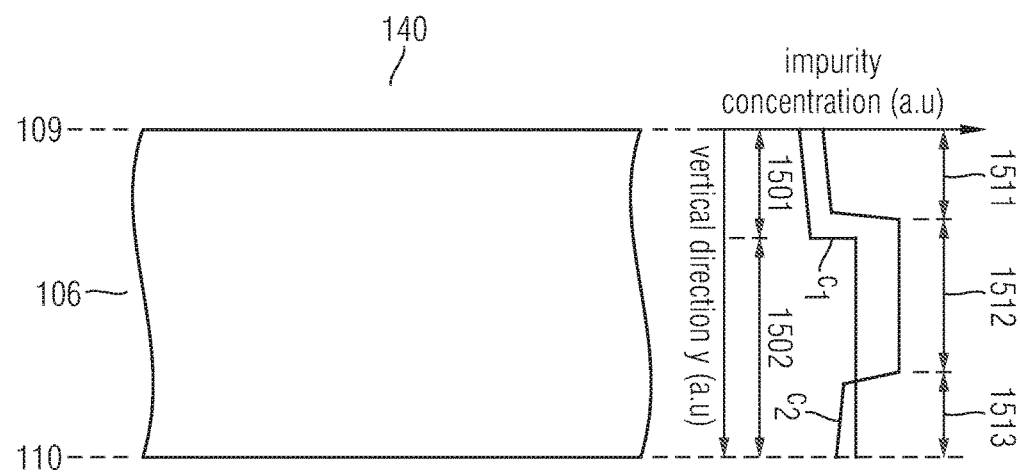
FIG. 2A is a schematic cross-sectional view of embodiments of a semiconductor device 140 comprising a silicon body 106 and an impurity concentration along a vertical direction y between the opposite first and second sides 109, 110 of the silicon body 106.

FIG. 2A is a schematic cross-sectional view of embodiments of a semiconductor device 140 comprising a silicon body 106 and an impurity concentration along a vertical direction y between the opposite first and second sides 109, 110 of the silicon body 106.

According to an embodiment, the semiconductor device 140 includes an impurity concentration $c_1$ of one of nitrogen and carbon along the vertical direction y. The semiconductor device 140 includes a first part 1501 of the silicon body 106 adjoining the first side 109 and a second part 1502 of the silicon body 106 between the first part 1501 and the second side 110. An average concentration of the one of nitrogen and carbon in the first part 1501 is less than 60%, or less than 30%, or less than 10% or even less than 5% of the average concentration of the one of nitrogen and carbon in the second part 1502. The average concentration in the first (second) part 1501 (1502) defines an impurity concentration averaged along a vertical extension of the first (second) part 1501 (1502). According to an embodiment, the impurity concentration $c_1$ of the one of nitrogen and carbon in the second part 1502 differs by less than 10%, or even less than 1% along the vertical direction y. Thus, the impurity concentration $c_1$ of the one of nitrogen and carbon in the second part 1502 is constant or nearly constant.

According to another embodiment, the semiconductor device 140 includes, in addition to first and second parts 1511, 1512 being correlated to each other in a similar way than the first and second parts 1501, 1502, a third part 1513 of the silicon body 106 between the second side 110 and the second part 1512. The reduced concentration in the third part 1513 can be achieved by a proton irradiation from a rear side with a subsequent annealing step, i.e. a subsequent heat treatment process, for example. The average concentration of the one of nitrogen and carbon in the third part 1513 is less than 60%, or less than 30%, or less than 10% or even less than 5% of the average concentration of the one of nitrogen and carbon in the second part 1512.

Figure 2B:
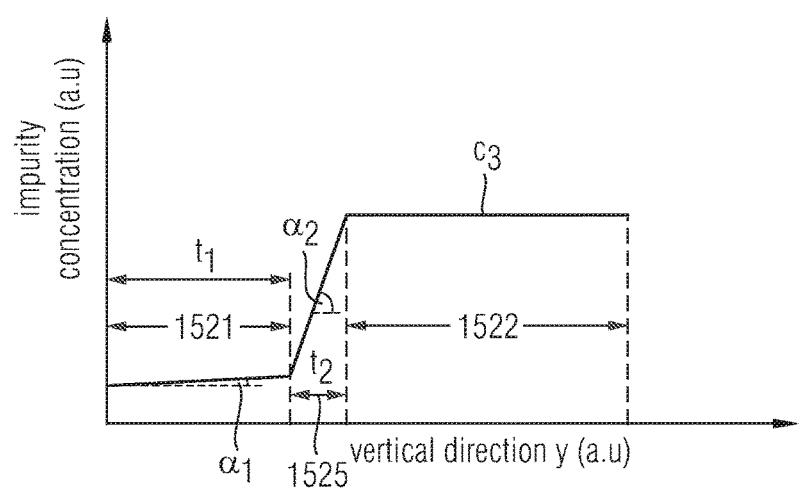
FIG. 2B is a schematic illustration of another embodiment of an impurity concentration along a vertical direction y between the opposite first and second sides 109, 110 of the silicon body 106.

According to yet another embodiment illustrated in FIG. 2B, an impurity concentration $c_3$ of one of nitrogen and carbon along the vertical direction y includes a transition region 1525 between first and second parts 1521, 1522. The first and second parts 1521, 1522 are correlated to each other in a similar way than the first and second parts 1501, 1502, 1511, 1512 illustrated in FIG. 2A.

According to an embodiment, a ratio of an average gradient $\alpha_2$ of the impurity concentration $c_3$ in the transition region 1525 and an average gradient $\alpha_1$ of the impurity concentration $c_3$ in the first part 1521 is greater than 3, or greater than 10, or greater than 100, or even greater than 1000.

According to another embodiment, a thickness $t_2$ of the transition region 1525 ranges between 1% to 30%, or between 2% to 20%, or between 3% to 10% of a thickness $t_1$ of the first part 1521.

The above relationships may likewise apply to a transition region between the second and third parts 1512, 1513 as illustrated in FIG. 2A.

The transition region 1525 may start in a depth of the silicon body 106 smaller than an end-of-range of irradiated particles and may end in a depth greater than an end-of-range of irradiated particles, for example.

According to an embodiment, a vertical distance between the first side 109 and the second part ranges between 10 µm and 200 µm, or between 40 µm and 180 µm, or even between 60 µm and 150 µm.

The semiconductor device 140 includes at least one of a vertical semiconductor device and a lateral semiconductor device, for example an IGFET such as a metal oxide semiconductor field effect transistor (MOSFET) including superjunction and non-superjunction IGFETs, IGBTs, diodes. According to an embodiment, the semiconductor device 140 is a discrete semiconductor device. According to another embodiment, the semiconductor device 140 is an integrated circuit. Other than an integrated circuit (IC), which consists of a few to billions of active devices manufactured and interconnected on a single semiconductor body, a discrete semiconductor device is a single transistor or a single diode in the semiconductor body without any other active semiconductor elements interconnected thereto. Although passive components such as resistors, capacitors and inductors may be formed in and/or on the semiconductor body, the discrete semiconductor device is specified to perform an elementary electronic function. Although the discrete semiconductor device may include a large number of transistor cells, the discrete semiconductor device is specified to perform an elementary electronic function and is not divisible into separate components functional in themselves as is typical for integrated circuits.

Figure 1C:
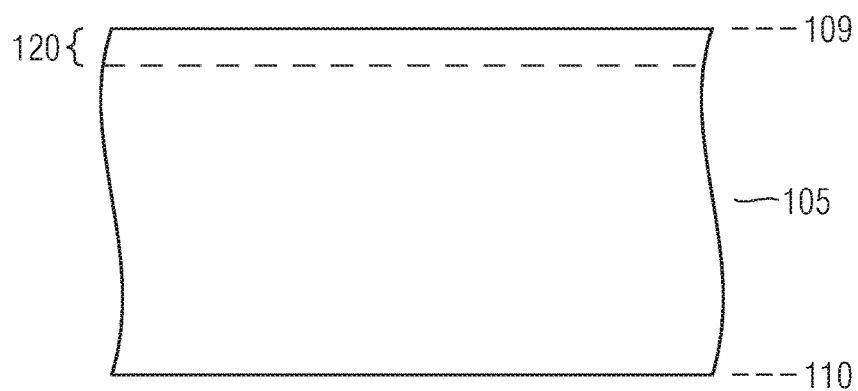
FIG. 1C is a schematic cross-sectional view of the semiconductor body of FIG. 1B for illustrating a process of forming a first load terminal structure at the first side of the semiconductor body being part of a method of manufacturing a semiconductor device.
Figure 3A:
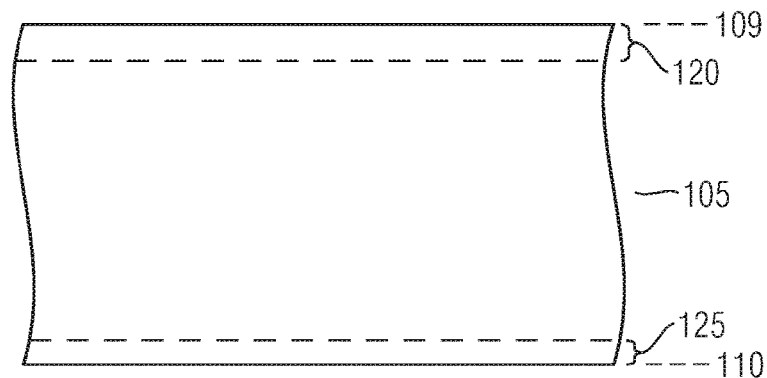
FIG. 3A is a schematic cross-sectional view of a portion of a semiconductor body for illustrating a process of forming a second load terminal structure at the second side of the semiconductor body.
Figure 3B:
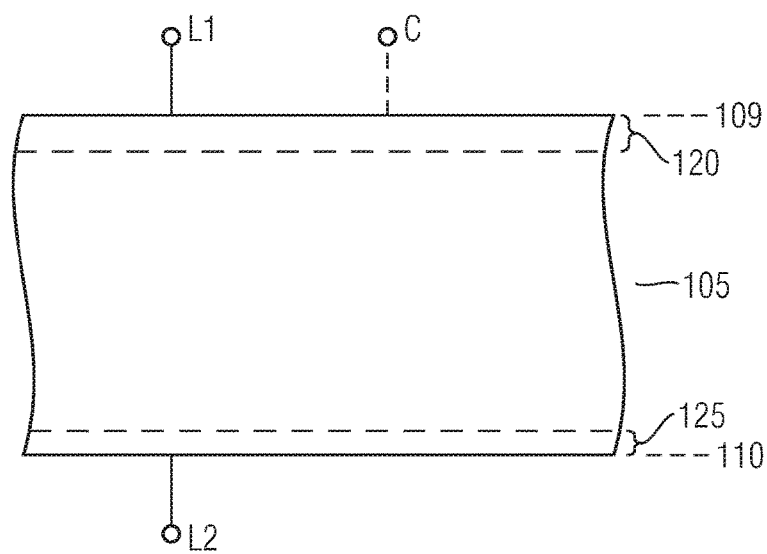
FIG. 3B is a schematic cross-sectional view of the semiconductor body of FIG. 3A for illustrating a process of forming contacts at the first and second sides of the semiconductor body.

One embodiment of manufacturing a vertical semiconductor device is illustrated in FIGS. 3A and 3B as schematic cross-sectional views of the semiconductor body of FIG. 1C for illustrating a process of forming a second load terminal structure 125 at the second side 110 of the semiconductor body 105.

The process may comprise doping processes of the semiconductor body 105 at the second side 110, e.g. diffusion and/or ion implantation processes for forming doped semiconductor region (s) in the semiconductor body 105 at the second side 110. The doped semiconductor region (s) in the semiconductor body 105 of the second load terminal structure 125 may include doped drain regions of a vertical FET, or a collector of an IGBT, or an anode or cathode region of a vertical power semiconductor diode, for example.

FIG. 3B is a schematic cross-sectional view of the semiconductor body 105 of FIG. 3A for illustrating a process of forming contacts at the first and second sides 109, 110 of the semiconductor body 105.

The process of forming contacts at the first and second sides 109, 110 may comprise forming one or a plurality of patterned conductive layers such as metallization layers electrically isolated by interlevel dielectric layer (s) sandwiched between. Contact openings in the interlevel dielectric layer(s) may be filled with conductive material (s) to provide electrical contact between the one or the plurality of patterned conductive layers. The patterned conductive layer (s) and interlevel dielectric layer (s) may form a wiring area above the semiconductor body 105 at the first side 109, for example. A conductive layer, e.g. a metallization layer or metallization layer stack may be provided at the second side 110, for example.

A first electrical load contact L1 to the first load terminal structure 120 and an electrical control terminal contact C to a control terminal structure, if present in the semiconductor device, may thus be formed in the wiring area above the first side 109. A second electrical load contact 12 to the second load terminal structure 125 may be formed at the second side 110.

The semiconductor device manufactured in the semiconductor body 105 including the process features illustrated in FIGS. 3A to 3B is a vertical semiconductor device having a current flow between first and second load terminal contacts L1, L2 between the opposite first and second sides 109, 110.

In case of a lateral semiconductor device, the second load terminal structure 125 and the second electrical load contact 12 are arranged at the first side 110.

Figure 4:
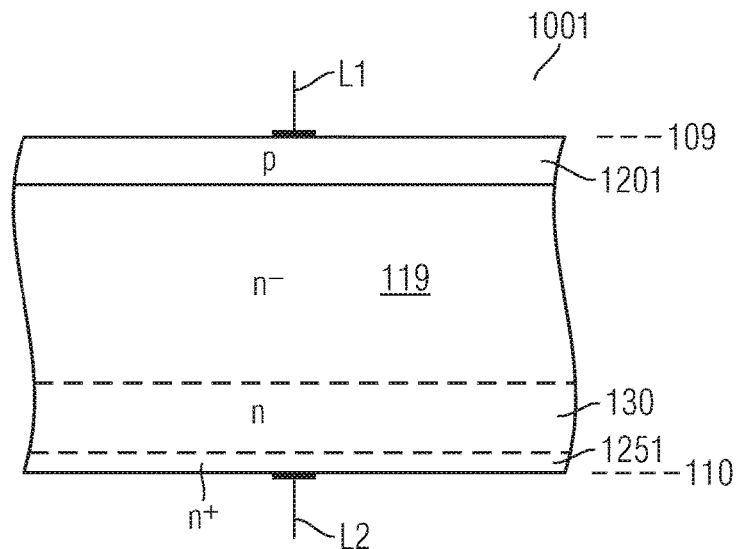
FIG. 4 is a schematic cross-sectional view of a semiconductor body comprising a power semiconductor diode including an impurity concentration as illustrated in FIGS. 2A, 2B.

FIG. 4 is a schematic cross-sectional view of the semiconductor body 105 illustrated in FIG. 3B after forming a power semiconductor diode 1001 comprising the impurity concentration $c_1$, $c_2$, $c_3$ of one of nitrogen and carbon as illustrated in FIGS. 2A, 2B. The power semiconductor diode 1001 includes an n⁻-doped drift zone 119. The n⁻-doped drift zone 119 may be part of an n⁻-doped base material, e.g. an n⁻-doped wafer. A p-doped anode region 1201 at the first side 109 is in electrical contact with the first load terminal contact L1. An n⁺-doped cathode region 1251 at the second side 110 is in electrical contact with the second load terminal contact 12. The anode region 1201 is one example of the first load terminal structure 120 illustrated in FIG. 3B. The cathode region 1251 is one example of the second load terminal structure 125 illustrated in FIG. 3B.

The power semiconductor diode 1001 may further comprise an optional n-doped field stop zone 130 between the n⁻-doped drift zone 119 and the n⁺-doped cathode region 1251.

Figure 5:
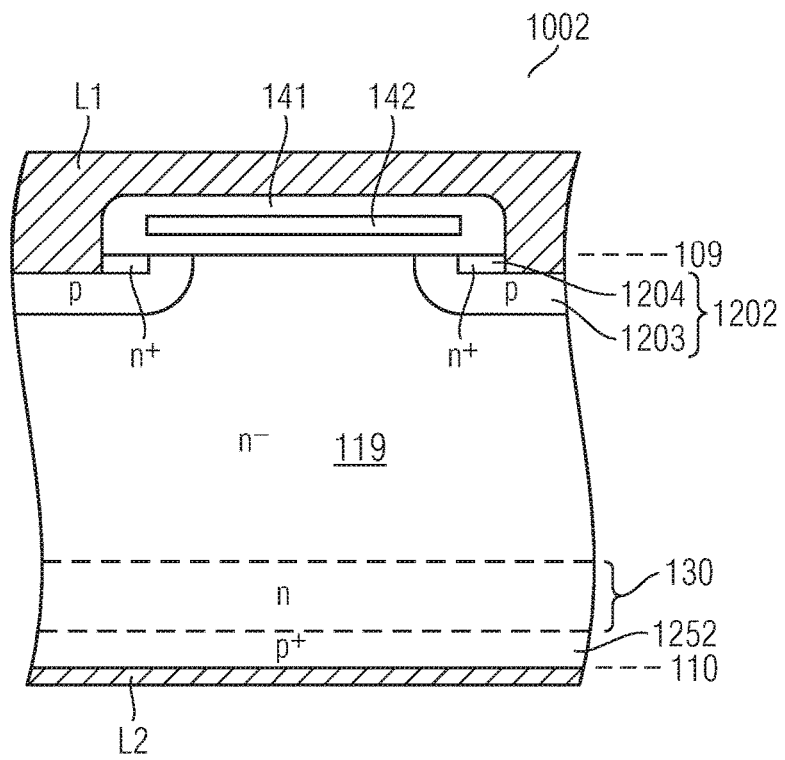
FIG. 5 is a schematic cross-sectional view of a semiconductor body of a power insulated gate bipolar transistor including an impurity concentration as illustrated in FIGS. 2A, 2B.

FIG. 5 is a schematic cross-sectional view of the semiconductor body 105 after forming a power IGBT 1002 comprising the impurity concentration $c_1$, $c_2$, $c_3$ of one of nitrogen and carbon as illustrated in FIGS. 2A, 2B. The power IGBT 1002 includes the n⁻-doped drift zone 119. The n⁻-doped drift zone 119 may be part of an n⁻-doped base material, e.g. an n⁻-doped wafer. An emitter structure 1202 at the first side 109 includes a p-doped body region 1203 and an n⁺-doped source region 1204. The emitter structure is in electrical contact with the first load terminal contact L1. A gate structure including a dielectric 141 and a gate electrode 142 is formed on the semiconductor body 105 at the first side 110. An IGBT collector including a V-doped rear side emitter 1252 at the second side 110 is in electrical contact to the second load terminal contact 12. The optional field stop zone 130 may be arranged between the n⁻-doped drift zone 119 and the n⁺-doped cathode region 1251.

The emitter structure 1202 is one example of the first load terminal structure 120 illustrated in FIG. 3B. The IGBT collector is one example of the second load terminal structure 125 illustrated in FIG. 3B. In case of an IGFET, the p⁺-doped rear side emitter 1252 may be replaced by an n⁺-doped drain region. In case of a superjunction device the drift zone 119 may include p- and n-doped regions alternatingly arranged along a lateral parallel to the first side 109, for example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a silicon body having opposite first and second sides, a first part of the silicon body adjoining the first side and a second part of the silicon body being disposed between the first part and the second side and a transition region between the first and second parts,
wherein an average concentration of one of nitrogen and carbon in the first part is less than 60% of an average concentration of the one of nitrogen and carbon in the second part;
wherein a vertical distance between the first side and the second part ranges between 10 µm and 200 µm and wherein a ratio of an average gradient $\alpha_2$ of the concentration of the one of nitrogen and carbon in the transition region and an average gradient $\alpha_1$ of the concentration of the one of nitrogen and carbon in the first part is greater than 3.

2. The semiconductor device of claim 1, wherein the silicon body is a magnetic Czochralski silicon body.

3. The semiconductor device of claim 1, further comprising a third part of the silicon body between the second side and the second part, wherein the average concentration of the one of nitrogen and carbon in the third part is less than 60% of the average concentration of the one of nitrogen and carbon in the second part.

4. The semiconductor device of claim 1, wherein the average concentration of the one of nitrogen and carbon in the second part differs by less than 10% along a vertical direction between the first and second sides.

5. The semiconductor device of claim 1, wherein a vertical distance between the first side and the second part ranges between 10 μm and 200 μm.

6. The semiconductor device of claim 1, wherein the semiconductor device is a vertical power semiconductor device comprising a first load terminal structure at the first side and a second load terminal structure at the second side.

7. The semiconductor device of claim 1, further comprising a transition region between the first and second parts, wherein a thickness t2 of the transition region ranges between 1% to 30% of a thickness t1 of the first part.

* * * * *